(12) United States Patent
Kang et al.

(10) Patent No.: US 8,436,410 B2
(45) Date of Patent: May 7, 2013

(54) SEMICONDUCTOR DEVICES COMPRISING A PLURALITY OF GATE STRUCTURES

(75) Inventors: Dae-Woong Kang, Seoul (KR); Sung-Nam Chang, Seoul (KR); Jin-Joo Kim, Seoul (KR); Kyong-Joo Lee, Suwon-si (KR); Eun-Jung Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 13/050,335

(22) Filed: Mar. 17, 2011

(65) Prior Publication Data

US 2011/0163367 A1 Jul. 7, 2011

Related U.S. Application Data

(63) Continuation-in-part of application No. 12/847,351, filed on Jul. 30, 2010, now Pat. No. 8,362,542, which is a continuation of application No. 11/551,680, filed on Oct. 20, 2006, now abandoned.

(30) Foreign Application Priority Data

Oct. 31, 2005 (KR) .................. 10-2005-0103107

(51) Int. Cl.
*H01L 29/788* (2006.01)
(52) U.S. Cl.
USPC ............ 257/315; 257/E21.581; 257/E21.209; 257/E21.613; 438/257

(58) Field of Classification Search .................. 257/314, 257/315, 321, 386, E21.581, E21.573, E21.209, 257/E21.613; 438/201, 211, 257
See application file for complete search history.

(56) References Cited

U.S. PATENT DOCUMENTS

| | | |
|---|---|---|
| 4,532,594 A | 7/1985 | Hosaka et al. |
| 6,468,877 B1 | 10/2002 | Pradeep et al. |
| 6,894,341 B2 | 5/2005 | Sugimae et al. |

(Continued)

FOREIGN PATENT DOCUMENTS

| | | |
|---|---|---|
| JP | 2002-76299 | 3/2002 |
| JP | 2003-078131 | 3/2003 |

(Continued)

OTHER PUBLICATIONS

Kang et al., "The Air Spacer Technology for Improving the Cell Distribution in 1 Giga Bit NAND Flash Memory", Samsung Electronics Co., Ltd., Kyungki-Do, Korea, IEEE, 2006, 2 pages.
Lee et al. "A Novel SONOS Structure of $SiO_2/SiN/Al_2O_3$ with TaN metal gate for multi-giga bit flash memeries", Samsung Electronics Co., Ltd., Kyungki-Do, Korea, IEEE, 2003, 4 pages.

*Primary Examiner* — David Vu
(74) *Attorney, Agent, or Firm* — Myers Bigel Sibley & Sajovec, P.A.

(57) ABSTRACT

Semiconductor devices are provided. The semiconductor devices may include a plurality of gate structures disposed on a semiconductor substrate, each of the gate structures including a floating gate, an inter-gate dielectric layer, and a control gate. The semiconductor devices may also include liners on opposing sidewalls of adjacent ones of the gate structures. The liners may define a gap. A first width of the gap may be less than a second width of the gap.

17 Claims, 20 Drawing Sheets

U.S. PATENT DOCUMENTS

| | | | |
|---|---|---|---|
| 7,704,851 B2 * | 4/2010 | Kim | 438/422 |
| 7,800,155 B2 * | 9/2010 | Matsuno | 257/315 |
| 2003/0151069 A1 | 8/2003 | Sugimae et al. | |
| 2004/0004863 A1 | 1/2004 | Wang | |
| 2004/0038489 A1 | 2/2004 | Clevenger et al. | |
| 2004/0232496 A1 | 11/2004 | Chen et al. | |
| 2005/0023597 A1 | 2/2005 | Futsukake et al. | |

FOREIGN PATENT DOCUMENTS

| | | |
|---|---|---|
| JP | 2005-39216 | 2/2005 |
| KR | 2002-0081926 A | 10/2002 |
| KR | 2003-0078750 | 10/2003 |
| KR | 2004-0018155 | 3/2004 |
| KR | 2005-0000324 | 1/2005 |

* cited by examiner

SEMICONDUCTOR DEVICES COMPRISING A PLURALITY OF GATE STRUCTURES

This application is a continuation-in-part of and claims priority from U.S. patent application Ser. No. 12/847,351, filed on Jul. 30, 2010, now U.S. Pat. No. 8,362,542 which is a continuation of and claims priority from U.S. patent application Ser. No. 11/551,680, filed Oct. 20, 2006, now abandoned which claims the benefit of Korean Patent Application No. 10-2005-0103107, filed on Oct. 31, 2005. The disclosures of each of these applications are incorporated herein by reference in their entireties.

BACKGROUND

1. Technical Field

This disclosure generally relates to semiconductor devices and, more particularly, to semiconductor memory devices and methods of fabricating the same.

2. Description of the Related Art

Among semiconductor devices, non-volatile memory devices are commonly used in consumer electronic devices because information can be retained in the device even when no power is supplied. Advances in consumer electronics cause demand for ever higher density memory devices. Efforts to manufacture devices meeting this demand often involve scaling down the sizes of gate structures and reducing the space between adjacent gate structures.

Unfortunately, these efforts often result in increased parasitic capacitance between adjacent structures in the memory cell regions. Such increases in parasitic capacitance reduce the speed of the memory devices. Also, variation in parasitic capacitance between gate structures causes a variation in the threshold voltage for each gate structure, thereby degrading the reliability of memory devices.

FIG. 1A is a circuit diagram of a typical NAND flash memory array, which is a popular type of non-volatile memory device. As shown in FIG. 1A, the NAND flash memory array includes a string select line SSL, a ground select line GSL, a common source line CSL, a plurality of word lines W/L#0-31, and a plurality of bit lines BL crossing across the other lines. FIG. 1B is a schematic plan view of a typical NAND flash memory array corresponding to FIG. 1A. In FIG. 1B, active regions 1 and bit line contacts 14 are illustrated together with floating gates 22. FIG. 1C is a cross-sectional view of a NAND flash memory structure of FIG. 1B taken along the wordline direction. In the wordline direction, a cell gate structure includes a control gate 24, an inter-gate dielectric layer 23, a floating gate 22, a tunnel oxide 21, and isolation regions 15 formed on a semiconductor substrate 10. FIG. 1D is a cross-sectional view of the NAND flash memory structure of FIG. 1B taken along the bitline direction. As shown in FIG. 1D, in the bitline direction a cell gate structure includes the control gate 24, the inter-gate dielectric layer 23, the floating gate 22, the tunnel oxide 21, and impurity regions 16 formed on the semiconductor substrate 10.

FIG. 2 is a perspective view of a portion of a NAND memory cell array. The capacitances between various portions of the memory cell array and the voltages on some of the floating gates are identified in FIG. 2. For example, $V_{fg}$ is a voltage at a central floating gate and $V_{cg}$ is a voltage at a central control gate. Further, V1 and V2 are voltages between adjacent floating gates in the x-direction; and V3 and V4 are voltages between adjacent floating gates in the y direction. Furthermore, V5 and V6 are voltages between . . . . In addition, C stands for parasitic overlap capacitance. Using the relationship Q=CV as applied to the structure in FIG. 2, Equation 1 and 2 are developed. Equation 1 describes the variation of the floating gate voltage ($\Delta V_{fg}$) in one of the NAND memory cells of FIG. 2 as a function of the surrounding capacitances and voltages.

$$\Delta V_{fg} = \frac{C_{fgy}(\Delta V_3 + \Delta V_4)}{C_{ono} + C_{tun} + 2C_{fgx} + 2C_{fgy} + 2C_{fgcg}} \quad \text{(Equation 1)}$$

As shown in Equation 1, decreasing $C_{fgy}$, the capacitance between adjacent floating gates 22 in the bitline direction, results in a decrease in the variation of the floating gate voltage ($\Delta V_{fg}$). Therefore, a low $C_{fgy}$ improves the threshold voltage distribution among the cell gates in the memory cell array.

Equation 2 describes the floating gate voltage ($V_{fg}$) of one of the memory cells of FIG. 2 as a function of the surrounding voltages and capacitances.

$$V_{fg} = \frac{C_{ono} * V_{cg} + C_{fgx}(V_1 + V_2) + C_{fgy}(V_3 + V_4) + C_{fgcg}(V_5 + V_6)}{C_{ono} + C_{tun} + 2C_{fgx} + 2C_{fgy} + 2C_{fgcg}} \quad \text{(Equation 2)}$$

As shown in Equation 2, decreasing $C_{fgy}$, results in an increase in $V_{fg}$. Consequently, the coupling ratio can be increased and the speed performance of the device can be improved.

From the analysis above, one method to improve device performance as device density is increased is to reduce the parasitic capacitance between adjacent floating gates. Typically, the spaces between adjacent floating gates are filled by an insulating layer whose dielectric constant is a primary factor in determining the capacitance between the adjacent floating gates. An insulating layer formed from a material having a higher dielectric constant will cause increased parasitic capacitance between adjacent gate structures. Consequently, it is desirable to form the dielectric layer from the lowest dielectric constant material possible.

Table 1 is a list of the approximate dielectric constants of several materials. Typical dielectric layers are formed from silicon oxide or silicon nitride materials. As shown in Table 1, these materials have dielectric constants of approximately 3.9 and 7.8, respectively. Air, on the other hand, has an approximate dielectric constant of 1.005. Consequently, a substantial reduction in the parasitic capacitance between adjacent gate structures can be achieved by replacing the silicon oxide or nitride dielectric material commonly used in semiconductor, e.g., memory structures with air. Further, it may be desired to fill as much of the space between adjacent gates as possible with air, as opposed to another dielectric material, to minimize/reduce the parasitic capacitance.

TABLE 1

| Material | Dielectric Constant |
| --- | --- |
| Vacuum | 1 (By definition) |
| Air | 1.005 |
| Polyethylene | 2.25 |
| Paper | 3 |
| Silicon oxide | 3.9 |
| Silicon nitride | 7.8 |
| Rubber | 7 |

TABLE 1-continued

| Material | Dielectric Constant |
| --- | --- |
| Silicon | 11.68 |
| Methyl alcohol | 30 |
| Water | 80 |
| Barium Titanate | 1200 |

One approach to reduce parasitic capacitance between adjacent gate structures is disclosed in U.S. Published Patent Application No. 20050023597 to Kutsukake et al. (hereinafter referred to as "Kutsukake"). In Kutsukake, air gaps are formed between gate structures simultaneously with gate sidewall spacers due to the conformal dielectric layer deposition process. Another approach is disclosed in Korean Published Patent Application 2002-0081926, in which air gaps are formed by depositing a thicker spacer layer on an upper portion of gate sidewalls than on a bottom portion thereof. One disadvantage of these approaches is that the area between adjacent gates is largely filled with an oxide dielectric layer with a relatively small air pocket. Therefore, the parasitic capacitance between the gates is not reduced as much as it would be if substantially the entire area were filled by an air gap or pocket.

SUMMARY

Some embodiments of disclosure are directed to methods of forming gaps between adjacent gate structures that increase/maximize the volume filled by the gap in order to reduce/minimize the parasitic capacitance between the gate structures, as well as devices fabricated in accordance with the methods.

In some embodiments, a semiconductor device includes a plurality of gate structures on a surface of a semiconductor substrate, each of the gate structures including a floating gate, an inter-gate dielectric layer, and a control gate, and liners on opposing sidewalls of adjacent first and second ones of the gate structures. Spacers may be on the opposing sidewalls of the first and second gate structures, the spacers being spaced apart from the surface of the substrate. A gap may be defined between the liners on the opposing sidewalls of the first and second gate structures and between the surface of the substrate and the spacers. A first width of the gap between the liners may be adjacent the surface of the substrate and may be less than a second width of the gap between the liners that is more distant from the surface of the substrate.

In some embodiments, each of the spacers may have a vertical portion abutting one of the sidewalls of one of the first and second gate structures, and a width of at least one of the spacers may narrow in a direction away from the surface of the substrate.

In some embodiments, a thickness of each of the liners may be smaller than that of each of the spacers.

In some embodiments, the liners may extend contiguously across the surface of the substrate.

In some embodiments, the liners may be conformally formed on the opposing sidewalls of the first and second gate structures and on the substrate.

In some embodiments, a shape of the gap may correspond to the liners defining the sidewalls thereof.

In some embodiments, the second width of the gap may be substantially planar.

In other embodiments, the second width of the gap may be substantially concave.

In some embodiments, each of the spacers may expose portions of the opposing sidewalls of the first and second gate structures.

In some embodiments, the spacers may define an opening in the second width of the gap.

In some embodiments, the semiconductor device may further include an insulating layer between the first and second gate structures, the insulating layer on the spacers to seal the opening defined by the spacers.

In some embodiments, the insulating layer may have a protruded portion and the protruded portion may be disposed between the spacers.

In some embodiments, the second width of the gap may be greater than that of the protruded portion.

In some embodiments, a width of the gap may increase from the first width of the gap to the second width of the gap.

In some embodiments, the liners on the opposing sidewalls of the first and second gate structures may come into contact with each other.

In other embodiments, the first width of the gap may be defined by the surface of the substrate.

In some embodiments, the spacers on the opposing sidewalls of the first and second gate structures may contact each other.

In some embodiments, the protruded portion may be more distant from the surface of the substrate than a portion of at least one of the spacers.

According to further embodiments, a semiconductor device may include a plurality of gate structures on a surface of a semiconductor substrate, each of the gate structures including a floating gate, an inter-gate dielectric layer, and a control gate. The semiconductor device may also include liners on opposing sidewalls of first and second adjacent ones of the gate structures. The semiconductor device may further include an insulating layer between the first and second gate structures, the liners being between the insulating layer and the surface of the substrate. A gap may be defined between the liners on the opposing sidewalls of the first and second gate structures and between the surface of the substrate and the insulating layer. A first width of the gap between the liners may be adjacent the surface of the substrate and may be less than a second width of the gap between the liners that is defined by the insulating layer.

According to yet other embodiments, a semiconductor device may include a plurality of gate structures on a surface of a semiconductor substrate, each of the gate structures including a floating gate, an inter-gate dielectric layer, and a control gate. The semiconductor device may also include liners on opposing sidewalls of first and second adjacent ones of the gate structures. The semiconductor device may further include an insulating layer between the first and second gate structures, the liners being between the insulating layer and the surface of the substrate. A gap may be defined between the liners on the opposing sidewalls of the first and second gate structures and between the surface of the substrate and the insulating layer. A first width of the gap between the liners may be defined by the surface of the substrate and may be less than a second width of the gap between the liners that is defined by the insulating layer.

As a result of the embodiments, the volume of the gaps may be increased/maximized in order to reduce/minimize the parasitic capacitance and any variance therein between the gate structures.

BRIEF DESCRIPTION OF THE DRAWINGS

The foregoing and other features and advantages of the disclosure will become more apparent by describing in detail exemplary embodiments thereof with reference to the following drawings.

DETAILED DESCRIPTION OF EXAMPLE EMBODIMENTS

Figure 1A:
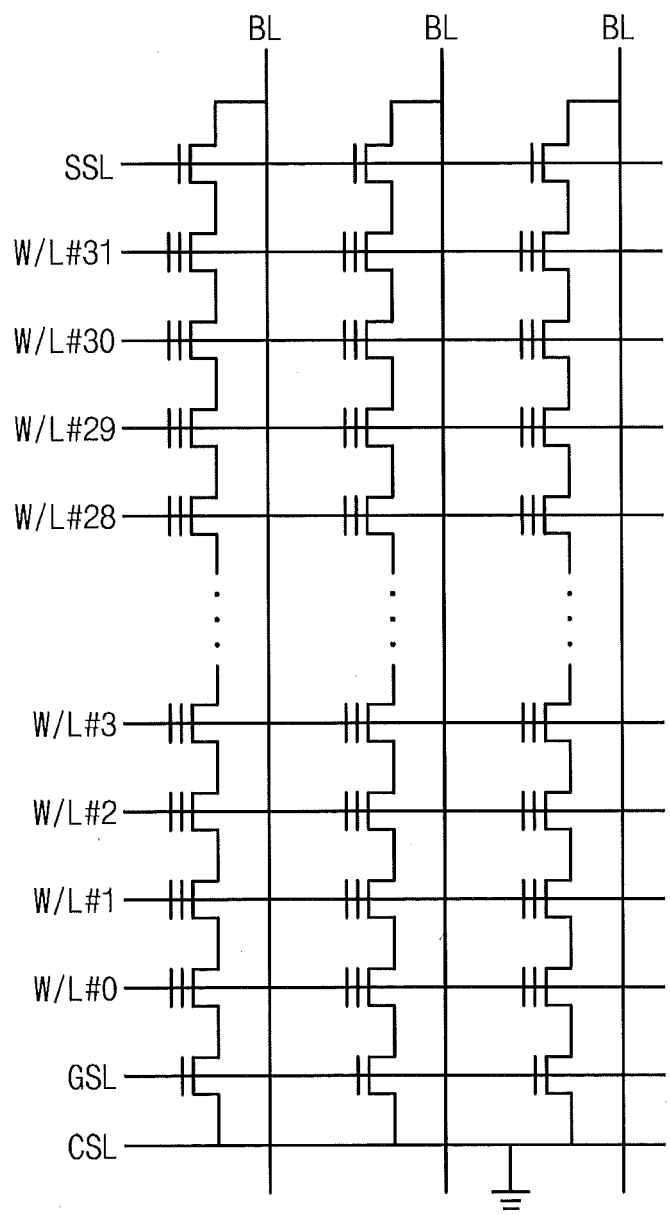
FIG. 1A is a circuit diagram of a typical NAND flash memory array.
Figure 1B:
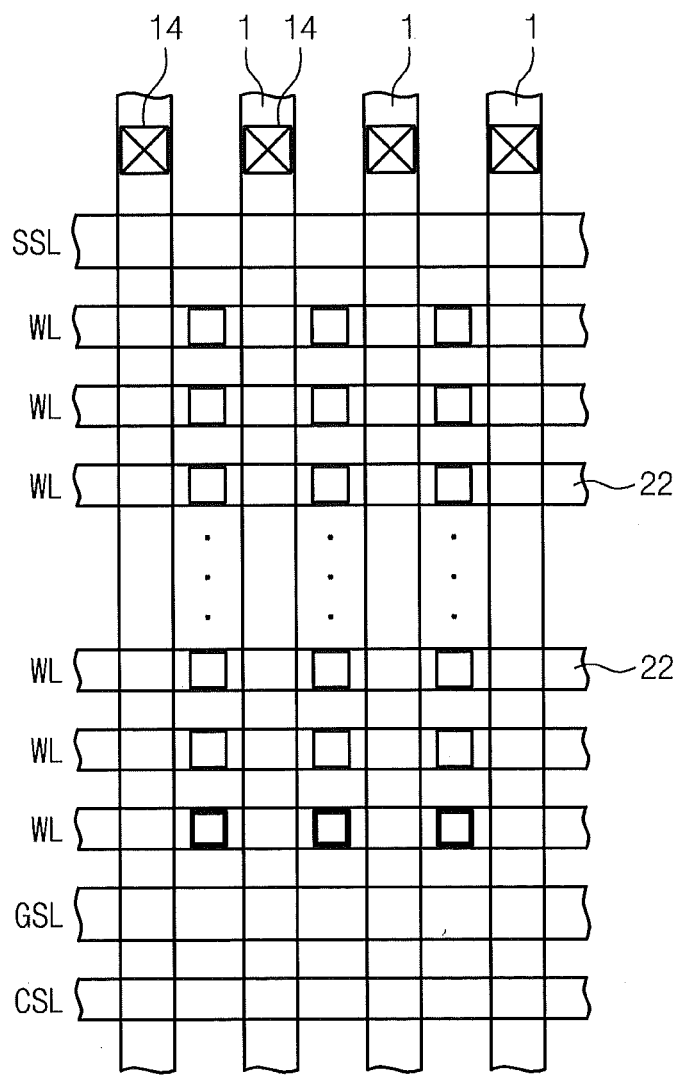
FIG. 1B is a plan view of a typical NAND flash memory array corresponding to the schematic view of FIG. 1A.
Figure 1C:
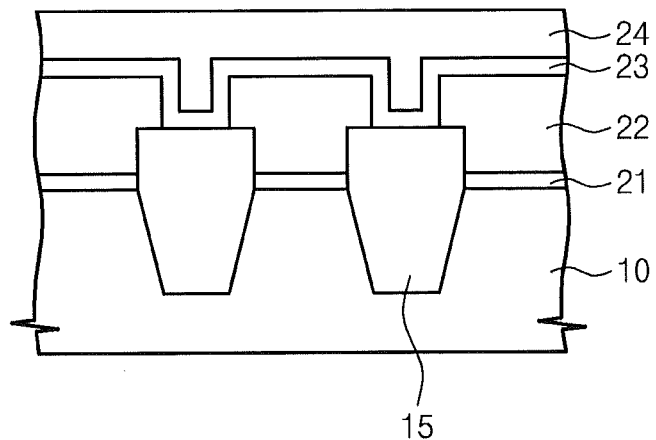
FIG. 1C is a cross-sectional view of a NAND flash memory structure of FIG. 1 taken along the wordline direction.
Figure 1D:
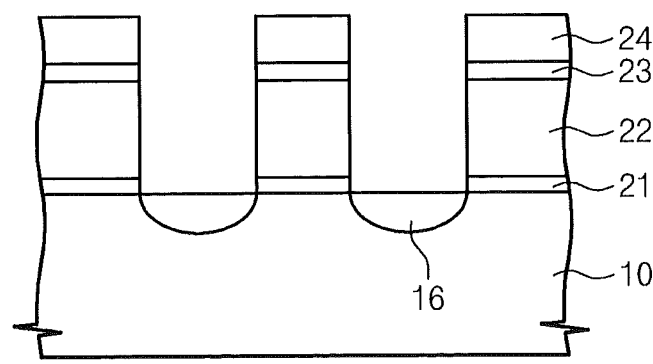
FIG. 1D is a cross-sectional view of a NAND flash memory structure of FIG. 1 taken along the bitline direction.
Figure 2:
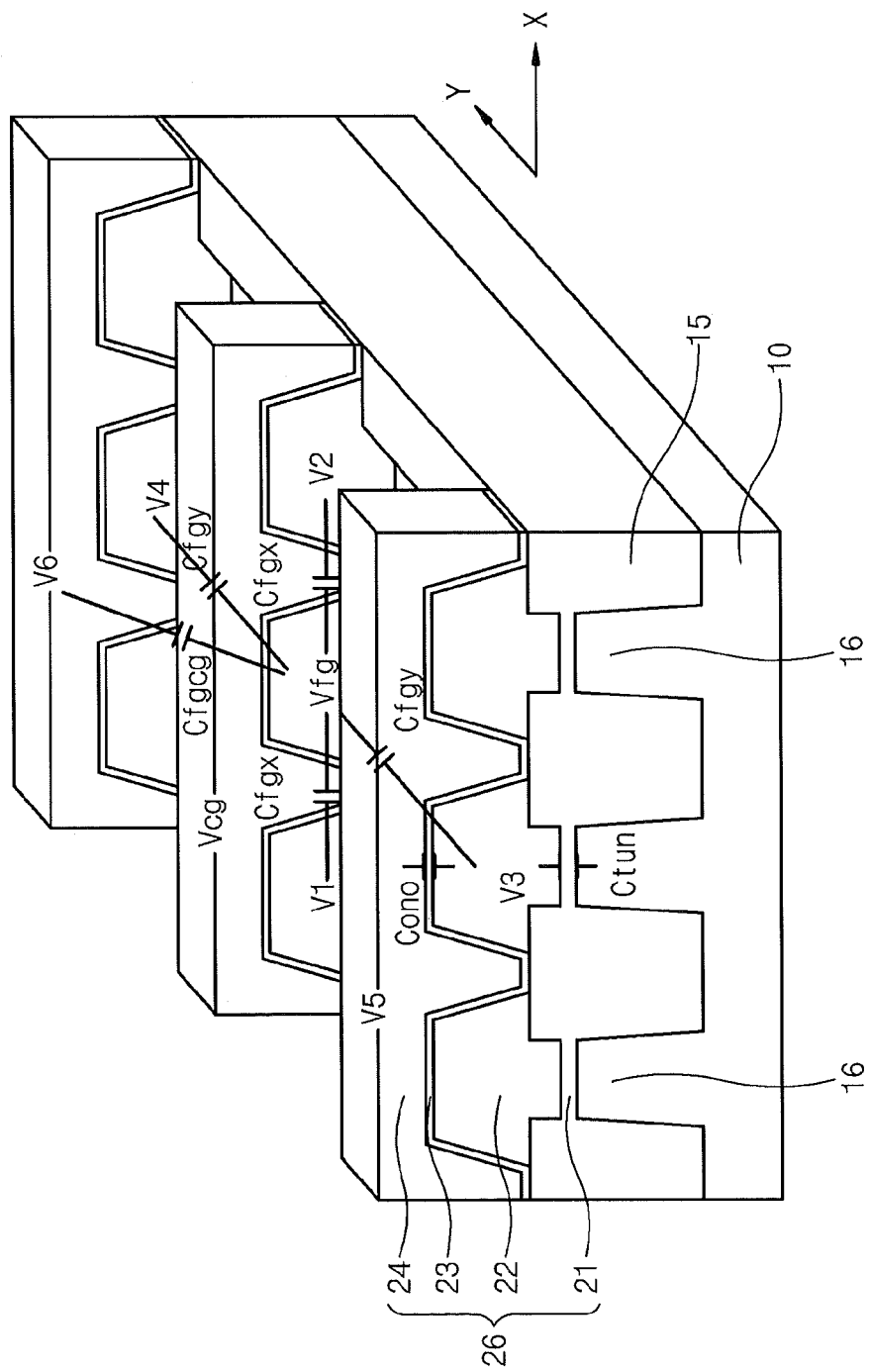
FIG. 2 is a perspective view of a NAND flash memory structure showing various voltages and capacitances associated with the structure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
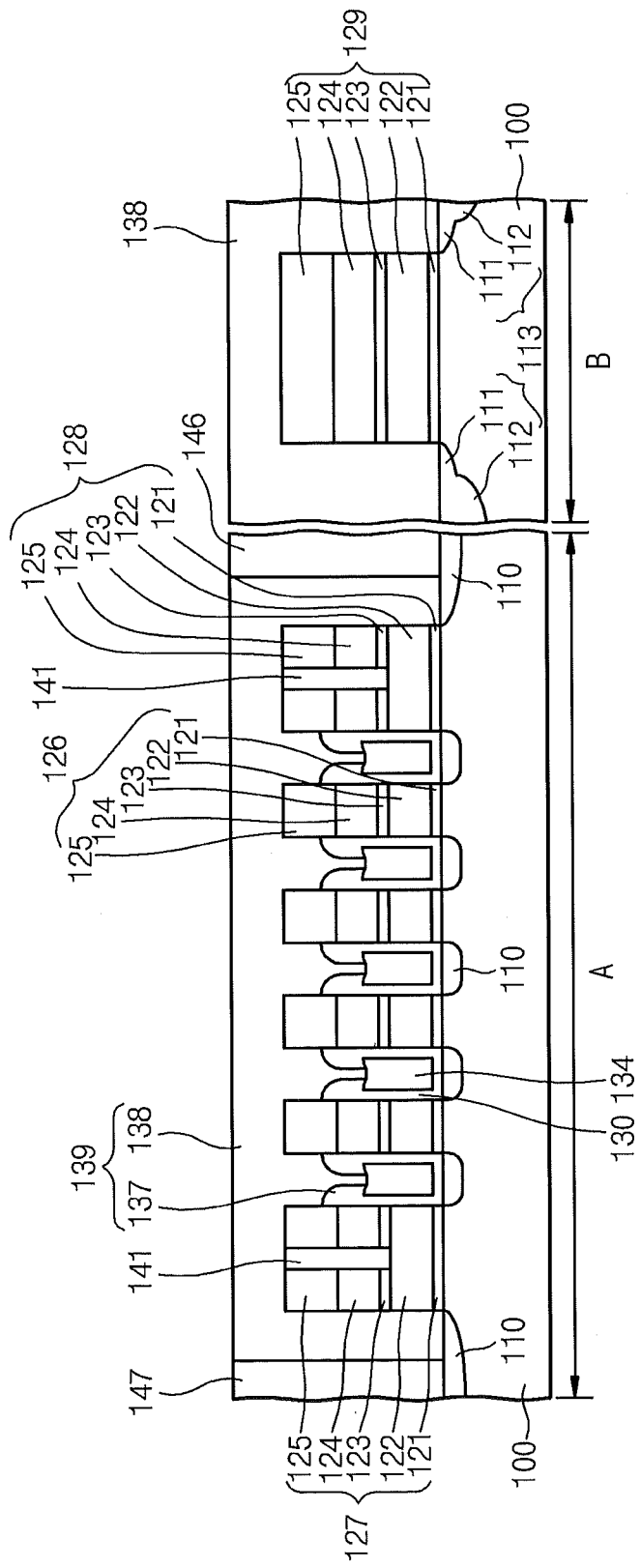
FIG. 3 is a cross-sectional view of a non-volatile memory structure in accordance with some embodiments.

FIG. 3 is a partial cross-sectional view of a semiconductor device in accordance with some embodiments.

Referring to FIG. 3, a semiconductor device includes a plurality of gate structures, e.g., a ground select gate structure 127, a plurality of cell gate structures 126, a string select gate structure 128, and a high voltage gate structure 129. The gate structures may be fabricated on a semiconductor substrate 100 with the ground select, cell, and string select gate structures (127, 126, and 128, respectively) formed in a cell region A of the substrate 100, and the high voltage gate structure 129 formed in a peripheral region B of the substrate 100. Although not shown, a low voltage gate structure may also be formed in the peripheral region B. Each gate structure may include a tunneling dielectric pattern 121, a charge-storage layer 122, an inter-gate dielectric layer 123, a control gate 124, and a hard mask 125 sequentially stacked on the substrate 100. The cell gate structures 126 include the charge-storage layer 122 to store a charge therein for programming. The charge-storage layer 122 may be a polysilicon floating gate or a known charge-trap dielectric layer formed of a material such as silicon nitride (SiN) or hafnium aluminum oxide (HfAlO). The charge-storage layer 122 may also be formed of a material including silicon nano-crystals. The ground select gate structure 127 and string select gate structure 128 each have an abutting contact 141 to allow direct electrical contact through the gate structures to the charge-storage layer 122.

A protection layer 130 (refer briefly to FIG. 5) may cover the gate structures (126, 127, 128, and 129) and the substrate 100. Alternatively, the protection layer 130 may be omitted depending on applications, which will be explained further below.

An insulation layer pattern 137 is disposed between adjacent cell gate structures 126, between the ground select gate structure 127 and a cell gate structure 126, and between the string select gate structure 128 and a cell gate structure 126. The insulation layer pattern 137 and the protection layer 130, if formed, may collectively define a plurality of air gaps 134 between the adjacent gate structures. The air gaps 134 may be substantially rectangular in cross-section, as will be explained further below. The air gaps 134 may be formed self-aligned with opposing sidewalls of the at least two adjacent gate structures.

An upper insulation layer 138 may cover the gate structures and the air gaps 134. The upper insulation layer 138 may seal the air gaps 134. A bottom portion of the upper insulation layer 138 may overlie the top of the air gaps 134.

Thus, in accordance with some embodiments, and as may be seen well in the cross-sectional view of FIG. 3, the air gaps 134 may be substantially rectangular in cross-section, featuring substantially right-rectilinear sides and sharp, about ninety-degree corners. Moreover, the widths of rectangular air gaps 134 may be highly uniform over their height. As will be seen by reference to FIG. 11, the performance of devices, especially the illustrated NAND flash memory, made in accordance with embodiments described herein exhibit significantly higher operating speeds than with prior art devices without an air gap of substantially rectangular shape and uniform width between adjacent gate structures.

Impurity regions 110 for forming source/drain regions may be disposed between the gate structures and below the air gaps 134. The high voltage gate structure 129 may have associated impurity regions 113 including lightly doped drains (LDD) 111 and highly doped regions 112.

A top of the cell gate structure 126 may be higher than a top of the air gaps 134.

According to other embodiments, other combinations of materials for forming the cell gate structures 126 and the substrate 100 are also possible. For example, the cell gate structure 126 may be a Silicon-Oxide-Nitride-Oxide-Silicon (SONOS) cell gate structure that includes a silicon oxide tunneling dielectric pattern on a silicon substrate, a nitride (such as silicon nitride) charge-trap layer on the tunneling dielectric pattern, a silicon oxide inter-gate dielectric layer on the charge-trap layer, and a polysilicon control gate on the inter-gate dielectric layer. As another example, the cell gate structure 126 may be a Silicon-Aluminum Oxide-Nitride-Oxide-Silicon (SANOS) cell gate structure that includes a silicon oxide tunneling dielectric pattern on a silicon substrate, a nitride (such as silicon nitride) charge-trap layer on the tunneling dielectric pattern, an aluminum oxide ($Al_2O_3$) inter-gate dielectric layer on the charge-trap layer, and a polysilicon control gate on the inter-gate dielectric layer. Yet another example would be a Tantalum-Aluminum Oxide-Nitride-Oxide-Silicon (TANOS) cell gate structure, which comprises a silicon oxide tunneling dielectric pattern on a silicon substrate, a silicon nitride charge-trap layer on the tunneling dielectric pattern, an aluminum oxide ($Al_2O_3$) inter-gate dielectric layer on the charge-trap layer, and a tantalum nitride (TaN) control gate on the inter-gate dielectric layer.

According to some embodiments, a gate group comprises a ground select gate structure 127, a string select gate structure 128, and a plurality of cell gate structures 126 disposed between the ground select gate structure 127 and the string select gate structure 128. In addition, a common source line 147 may be formed adjacent the ground select gate structure 127.

In accordance with some embodiments, the ground select gate structure 127 and the string select gate structure 128 each have a first sidewall facing the cell gate structures 126 and a second sidewall opposite the first sidewall. The insulation layer pattern 137, the protection layer 130, or both, may be formed on the first sidewalls, but may not be placed on some or all of the second sidewalls.

With no protection layer 130 and/or the insulation layer pattern 137 disposed on the second sidewall of the string select gate structure 128 facing (adjacent) a bit line contact 146 in a direct contact (DC) region, voids leading to shorts in the DC region, particularly between the bit line contacts 146 can be avoided. Further, when there is no protection layer 130 and/or insulation layer pattern 137 disposed on the second sidewall of the ground select gate structure 127 facing the common source line 147, the devices can be further scaled down without reducing the width of the common source line 147. This prevents resistance from being increased in the area of the common source line 147.

Also, the insulation layer pattern 137 may be or may not be placed on either sidewall of the high voltage gate structure 129 depending on applications.

As discussed in the background, it may be desirable to increase/maximize the volume of the air gaps 134 between adjacent charge-storage layers 122 in order to reduce/minimize the parasitic capacitances. To accomplish this, the air gap 134 may be substantially rectangular in cross-section. Also, the air gap 134 may have a substantially uniform width along most, if not all, of its height. The width of each air gap 134 may be measured from one sidewall of the air gap 134 to the opposite sidewall of the air gap 134 along the direction parallel to the plane of the substrate 100. In order to have a substantially uniform width, the air gaps 134 may have substantially vertical sidewalls with respect to the substrate 100. The air gaps 134 may also have substantially horizontal tops and bottoms. The air gaps 134 may extend along substantially the entire sidewalls of the charge-storage layer patterns 122. In other words, the air gaps 134 may extend vertically from the substrate 100 to an extent greater than or equal to the vertical extent of the charge-storage layers 122. Depending on applications, however, the air gaps 134 may not need to extend along the entire sidewalls of the charge-storage layer patterns 122.

Those of skill in the art will appreciate that the substantially uniform width of the air gaps 134 in accordance with some embodiments, while reducing/minimizing parasitic capacitance due to greater air gap volume, may also reduce/minimize any variation in parasitic capacitance over most if not all of the height of the air gap. This is due to the verticality of the sidewalls and due to the uniformity of width of the air gaps that produces the substantially rectangular cross-section of the air gaps 134. Unlike with prior art devices featuring curved or tapered sidewalls of variable width that produce air gaps of inversely variable width, embodiments described herein may have air gaps 134 the dielectric value of which is substantially the same over the substantial height of the air gaps 134. This may reduce/minimize variation in parasitic capacitance at various heights or near various irregular features of the air gaps 134 and their surrounding sidewalls that undesirably produce more, parasitic capacitance near the tops and bottoms of the air gaps than near the middles of the air gaps as typified by the prior art teardrop-shaped or oval air gaps. Thus, with features of the embodiments disclosed herein, the reliability of the semiconductor devices can be substantially improved.

According to some embodiments, the protection layer 130 may be formed conformally on the sidewalls of the gate structures, e.g., 126, and on the substrate 100 so as to form the sidewalls and bottoms of the air gaps 134. Vertical portions of the protection layer 130, disposed on opposing sidewalls of adjacent gate structures thereby defining the sidewalls of the air gaps 134, may have a substantially uniform thickness throughout the vertical extent of the air gaps 134. Horizontal portions of the protection layer 130, defining the bottoms of the air gaps 134, may have a substantially uniform thickness as well.

According to some other embodiments, the thickness of the vertical portions and the horizontal portions may be substantially the same. The inner sidewall of the vertical portions may form an approximately 90 degree angle with a top surface of the horizontal portions. The vertical portions of the protection layer 130 may be said to have an inner sidewall and an outer sidewall, the outer sidewall adjoining the sidewalls of the gate structures, and the inner sidewall may be substantially parallel with the sidewalls of the gate structures.

In accordance with some embodiments, the insulation layer pattern 137 and the protection layer 130 may form a spacer layer pattern on the sidewalls of the gate structures, e.g., 126. In such embodiments, the spacer layer pattern may include an upper portion and a lower portion. And the lower portion may have a substantially uniform thickness along substantially the entire sidewalls of the gate structures. If the protection layer 130 is not used, the insulation layer pattern 137 alone may form the spacer layer pattern on an upper portion of the sidewalls of the gate structures. Accordingly, the spacer layer pattern may not be formed between the air gaps 134 and the sidewalls of the gate structures. In other words, the sidewalls of the gate structures may directly define the sidewalls of the air gaps 134. Thus, if the protection layer 130 is not formed, the air gaps 134 may be primarily defined by the opposing sidewalls of the gate structure, e.g., 126, and the insulation layer pattern 137.

Further, if the protection layer 130 is not used to form the air gaps 134, the inter-gate dielectric layer 123 has an etch selectivity with respect to the first insulation layer 132 as will be further explained below in conjunction with FIGS. 5-6.

The spacer layer pattern may overhang a portion of the tops of the air gaps 134. The upper insulation layer 138 may cover the remaining portion of the tops of the air gaps 134. The protection layer pattern 130 may also not be formed between bottoms of the air gaps 134 and the substrate 100. In other words, the substrate 100 may directly define the bottoms of the air gaps 134.

FIGS. 4 through 10 are cross-sectional views illustrating methods of manufacturing a semiconductor device in accordance with some embodiments.

Figure 4:
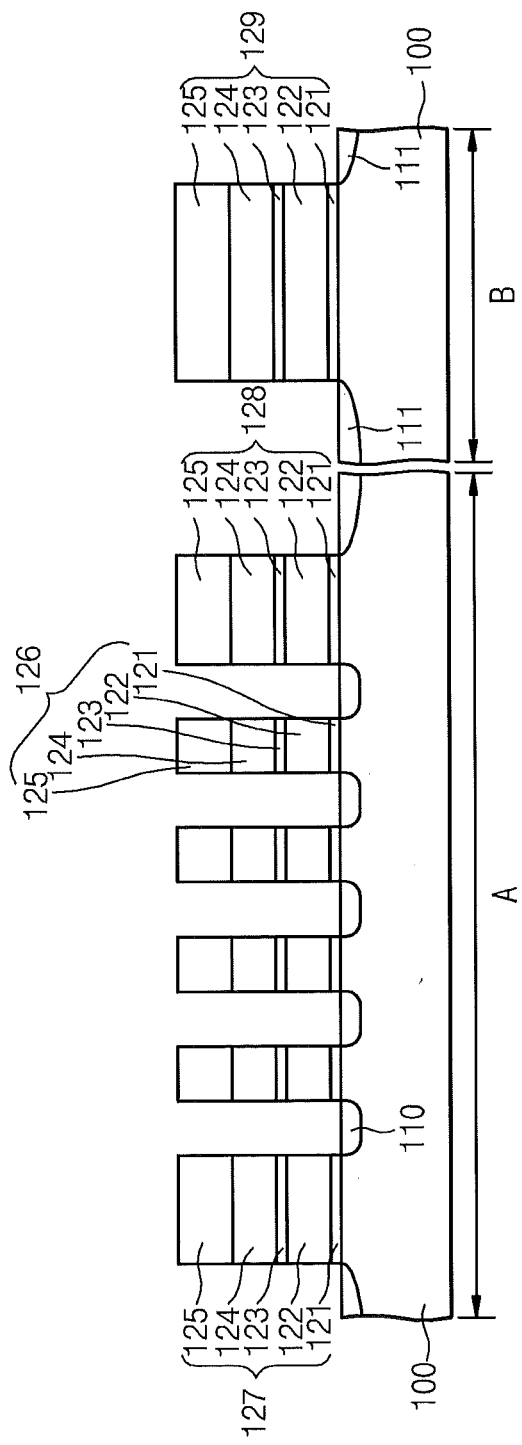
FIGS. 4 through 10 are cross-sectional views illustrating operations of manufacturing a non-volatile memory structure in accordance with some embodiments.

Referring to FIG. 4, manufacturing a semiconductor device, e.g., a flash memory structure includes forming a ground select gate structure 127, a string select gate structure 128, and a plurality of cell gate structures 126, between the ground select gate structure 127 and the string select gate structure 128, on a cell region A of a semiconductor substrate 100, and forming a high voltage gate structure 129 or a low voltage gate structure (not shown) on a peripheral region B of the substrate 100. The gate structures each may include a tunneling dielectric pattern 121, a charge-storage layer 122, an inter-gate dielectric layer 123, a control gate 124, and a hard mask 125, which are sequentially stacked. The hard mask 125 may comprise high-temperature oxide (HTO), nitride or other suitable material. The gate structures may then be used as implantation masks for self-aligned formation of source/drain regions 110 in the cell region A and LDD regions 111 in the peripheral region B.

Figure 5:
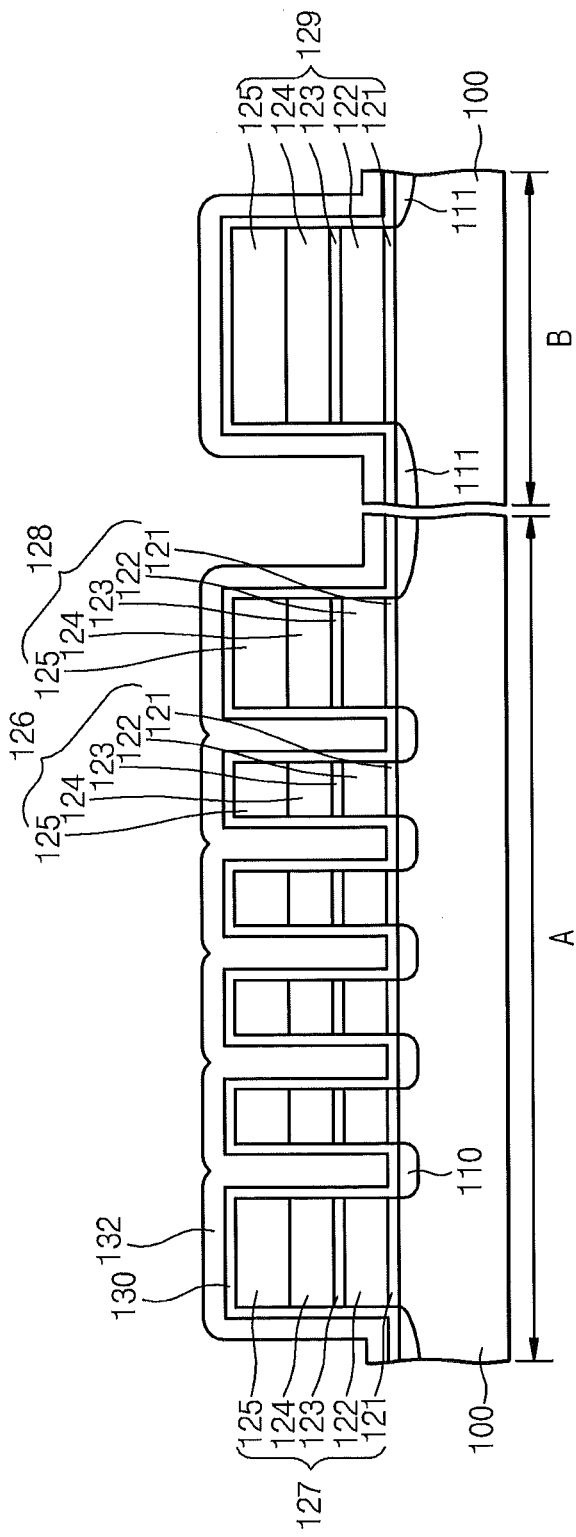

Referring to FIG. 5, a protection layer 130 may be conformally formed over the gate structures and the substrate 100, thereby covering the top and the sidewalls of the gate structures. Then, a first insulation layer 132 may be formed over the protection layer 130. The protection layer 130 may act as an etch stop layer during subsequent etch processes. The protection layer 130 may have an etch selectivity with respect to the first insulation layer 132. As an example, the protection layer 130 may be, but is not limited to, a silicon nitride layer, and the first insulation layer 132 may be a silicon oxide layer, for example. Specifically, the first insulation layer 132 may be a medium temperature oxide (MTO) layer deposited by a low pressure chemical vapor deposition (LPCVD) process, for instance. Also, the protection layer 130 may comprise any material having an etch selectivity with respect to the first insulation layer 132.

According to some embodiments, the protection layer 130 may not be formed, in which case the first insulation layer 132 may be directly formed on the top and the sidewalls of the gate structures. In such embodiments, the inter-gate dielectric layer 123 may have an etch selectivity with respect to the first insulation layer 132.

Figure 6:
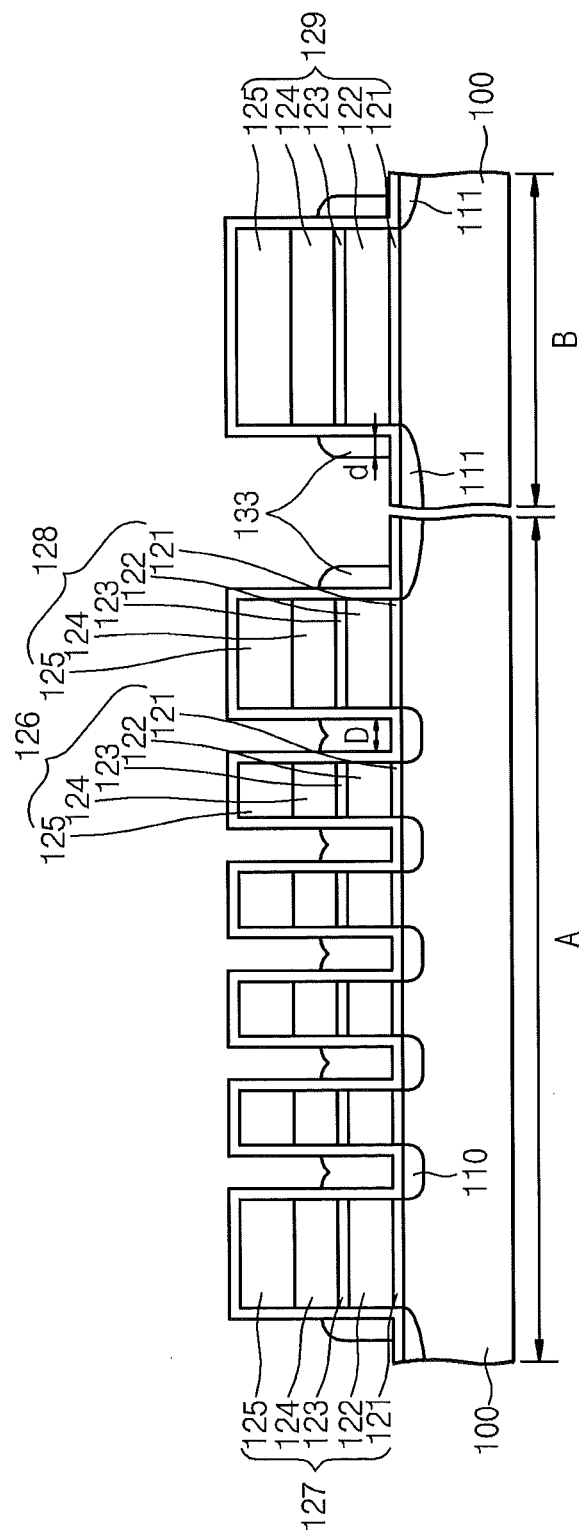

Referring to FIG. 6, a portion of the first insulation layer 132 is then removed, such as by etching to form an insulation layer pattern 133. The etching of the first insulation layer 132 may expose a region of the sidewalls of the gate structures. The insulation layer pattern 133 may thus be formed on the sidewalls of the gate structures and above the source/drain regions 110. In other words, the insulation layer pattern 133 may extend between the adjacent gate structures. If the protection layer 130 is used, it may remain on the tops and sidewalls of the gate structures and on the substrate 100 after the etching of the first insulation layer 132.

Figure 7:
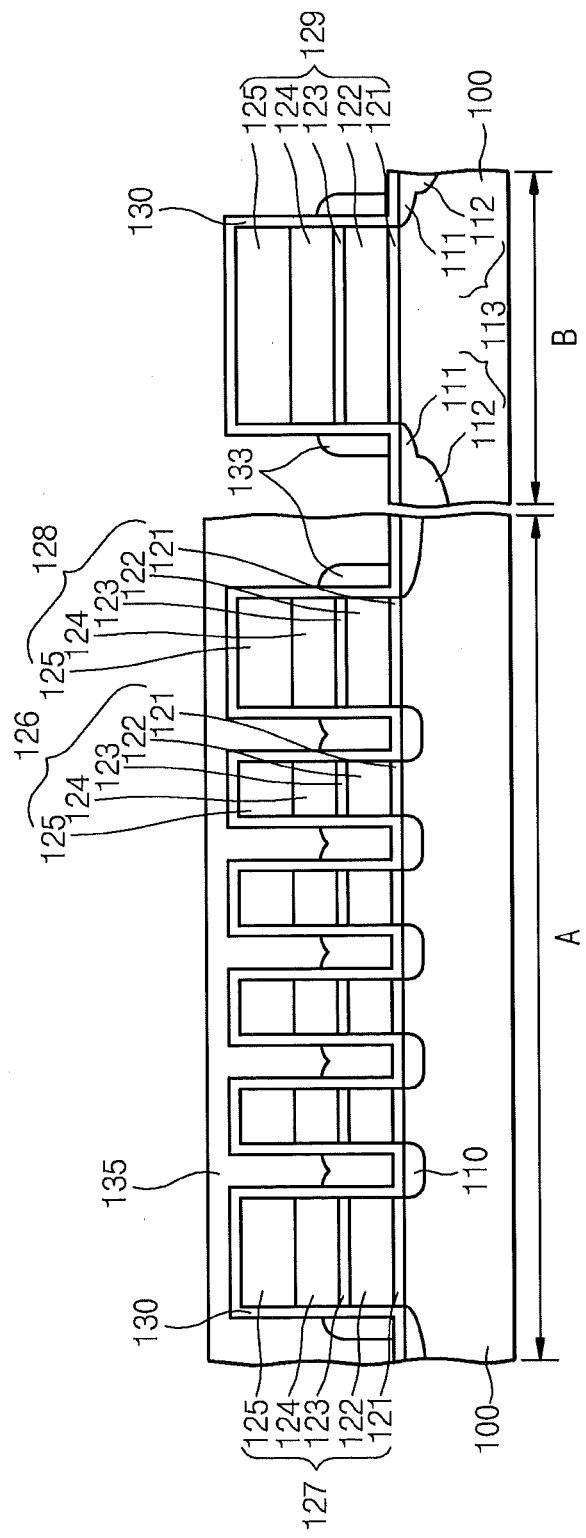

Referring to FIG. 7, a photoresist pattern 135 may be formed covering the cell region A. Impurity regions 113 may then be formed around the high voltage gate structure 129 by forming highly-doped regions 112 in addition to the already-formed LDD regions 111 in the peripheral region B. The highly-doped regions 112 may be formed by ion implantation using the high voltage gate structure 129 and the insulation layer pattern 133 as an implantation mask.

Figure 8:
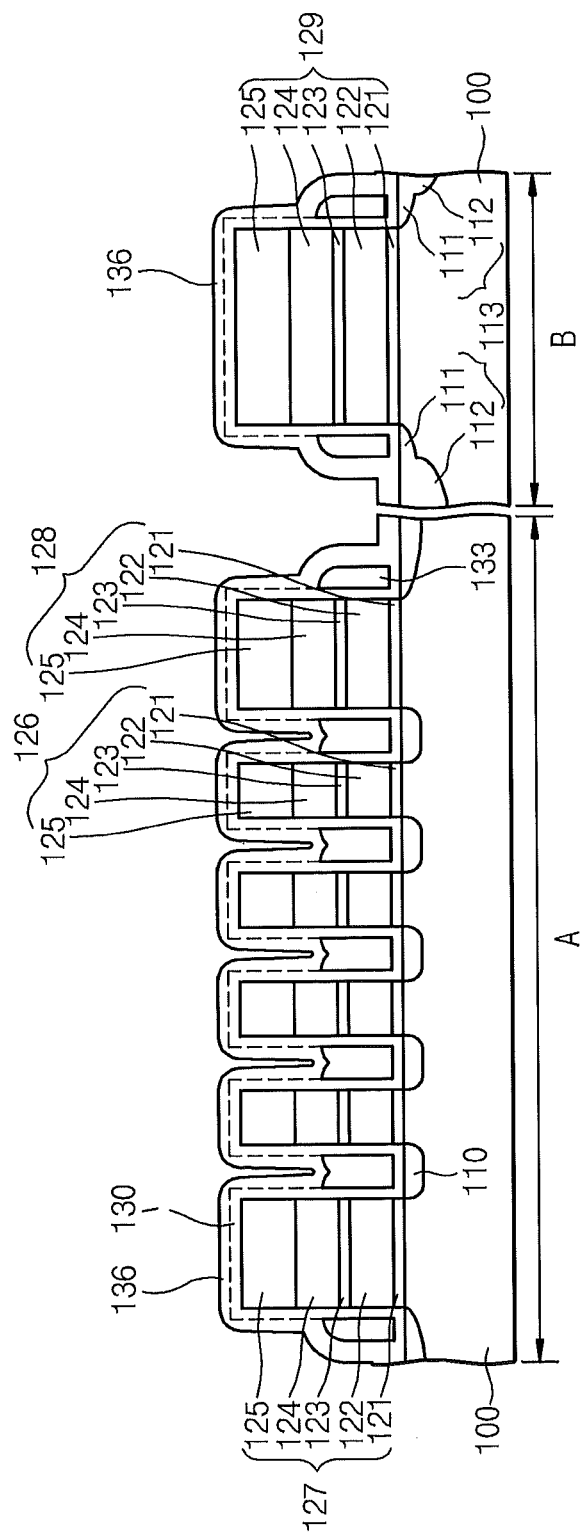
Figure 9:
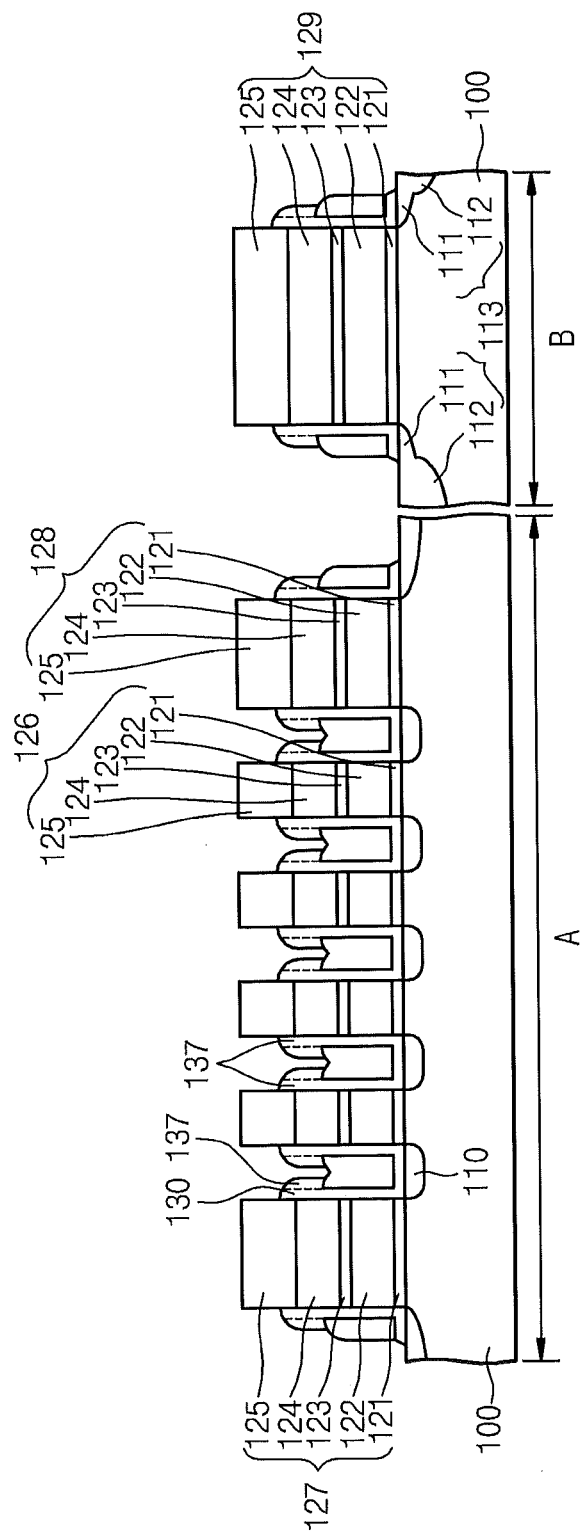

Referring to FIGS. 8 and 9, the photoresist pattern 135 may be removed using conventional techniques such as ashing. Then, a second insulation layer 136 may be formed over the protection layer 130 (if used) and the insulation layer pattern 133. The second insulation layer 136 may be partially etched or etched back to form the insulation layer pattern 137. The insulation layer pattern 137 has an opening 131 to expose an upper surface of the insulation layer pattern 133. If the protection layer 130 is used, the etching of the second insulation layer 136 may include an etching of a portion of the protection layer 130, thereby exposing the top and a portion of the sidewalls of the hard mask 125.

Figure 10:
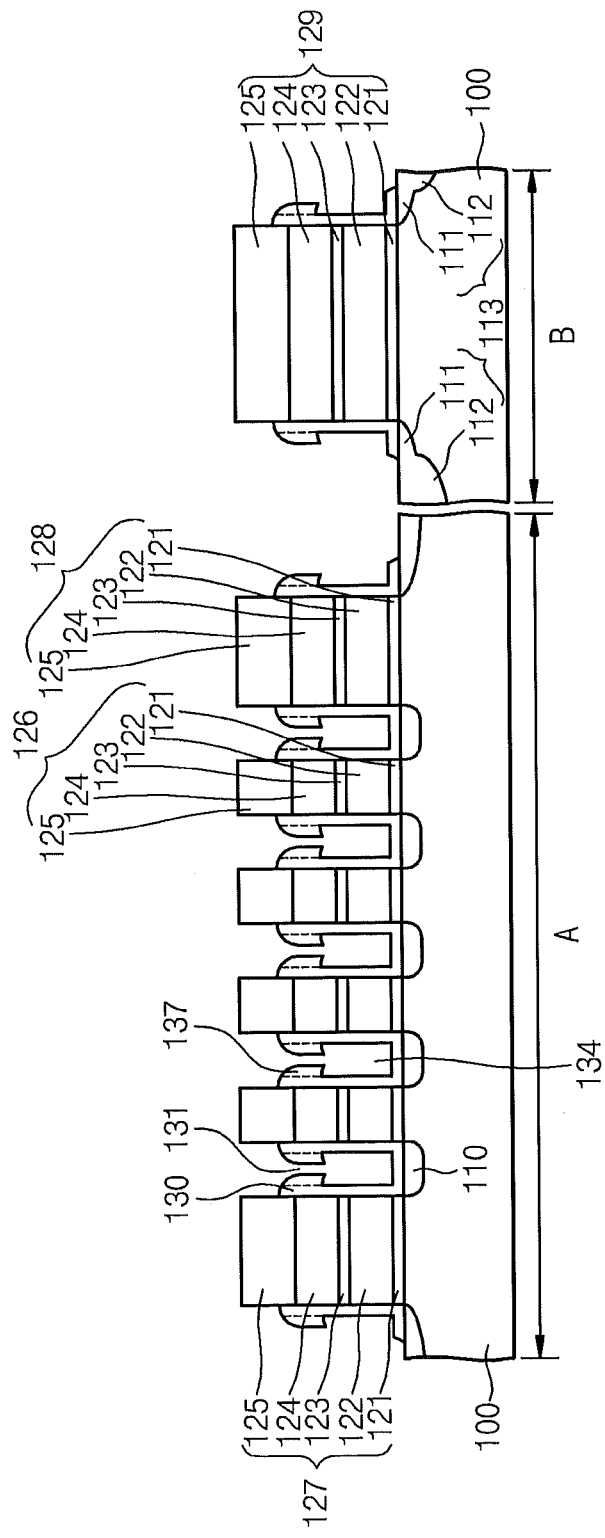

Referring to FIG. 10, the insulation layer pattern 133 may then be selectively removed by, for example, etching through the opening 131 defined by the insulation layer pattern 137, to form the air gaps 134. The air gaps 134 are substantially rectangular in cross-section to increase/maximize the size of the air gap 134 and to thereby reduce/minimize the adverse effect of parasitic capacitance between adjacent gate structures (and, as indicated above, further to reduce/minimize variances in any parasitic capacitance, i.e. to render uniform the parasitic capacitance, therebetween over the substantial height of the air gap 134).

If the protection layer 130 is used, the protection layer 130 may define the sidewalls and bottoms of the air gaps 134. Accordingly, the air gaps 134 may be substantially surrounded by the protection layer 130 and the insulation layer pattern 137. If the protection layer 130 is not used, the gate structures may directly define the sidewalls of the air gaps 134, and the substrate 100 may directly define the bottoms of the air gaps 134, as discussed above.

Wet etching may be used to remove the insulation layer pattern 133. For example, hydrofluoric acid may be used to etch the insulation layer pattern 133. The insulation layer pattern 137 and/or the protection layer 130 may act as an etch stop during the process for removing the insulation layer pattern 133.

Once the insulation layer pattern 133 has been removed, a portion of the insulation layer pattern 137 may form an overhang over the tops of the air gaps 134. If the protection layer 130 is used, it will prevent the gate structure, particularly the inter-gate dielectric layer 123, from being etched while the insulation layer pattern 133 is removed, e.g., etched. If the protection layer 130 is not used, it is desirable that the inter-gate dielectric layer 123 have an etch selectivity with respect to the insulation layer pattern 133 to protect itself from the etchant, as discussed above.

According to some embodiments, any remaining portions of the insulation layer pattern 137 and/or the protection layer 130 may be removed from one sidewall of the string select gate structure 128 and one sidewall of the ground select gate structure 127, as discussed above with reference to FIG. 3 although not illustrated. For example, in the cell region A, the region between adjacent string select gate structures 128, i.e., a DC region in which the bit line contact 146 is formed, may be opened while other regions are covered by, for example, a photoresist pattern. Then, the spacer layer pattern, i.e., the protection layer 130 and/or the insulation layer pattern 137, may be selectively removed from one of the sidewalls of the string select gate structures 128 in the DC region by, for example, wet etching using phosphoric acid or dry etching. As a result, the spacer layer pattern may be formed selectively not to extend along one of the sidewalls of the string select gate 128 adjacent the bit line contact 146.

In addition, the spacer layer pattern, i.e., the protection layer 130 and/or the insulation layer pattern 137, may be selectively removed from one of the sidewalls of the ground select gate structure 127 near the common source line 147, using the immediately-above-described method. As a result, the spacer layer pattern may be formed selectively not to extend along one of the sidewalls of the ground select gate structure 127 facing the common source line 147.

Also, in the peripheral region B, the spacer layer pattern may also be selectively removed from the high voltage gate structure 129 or the low voltage structure using the above method described to remove the spacer layer pattern in the cell region A. However, the spacer layer pattern may remain in the peripheral region B.

Referring again to FIG. 3, an interlayer insulation layer 138 may then be formed to cover the gate structures and the air gaps 134. In such embodiments, a bottom portion of the interlayer insulation layer directly overlies a top of the air gaps 134.

Afterwards, although not shown, a bit line may be formed on the resulting structure to be coupled to one of the plurality of impurity regions 110 via the bit line contact 146 adjacent the string select gate structure 128 from which the spacer layer pattern is removed.

Figure 11:
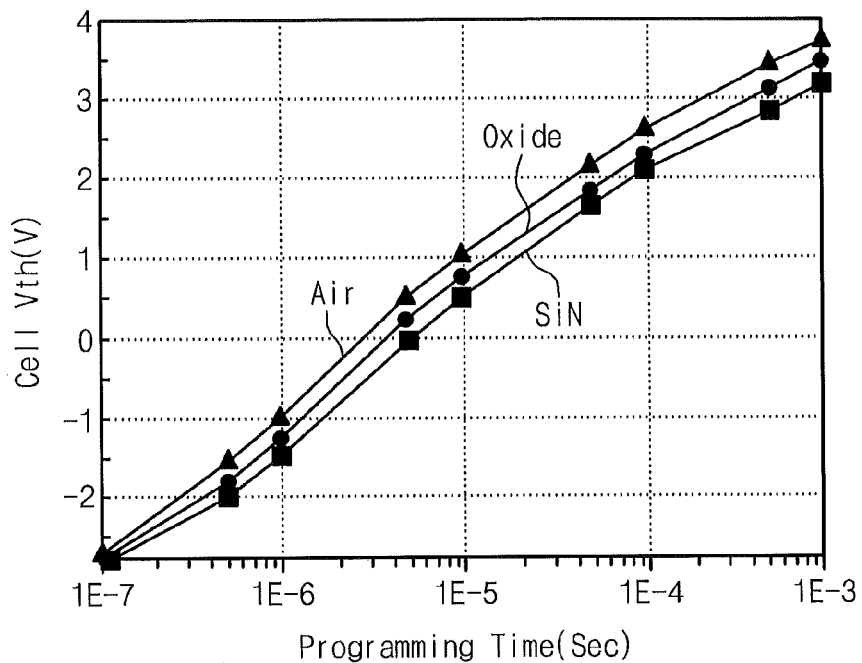
FIG. 11 is a graph showing experimental results of programming speed for devices fabricated according to some embodiments.

FIG. 11 is a graph showing experimental results of programming speed for devices fabricated according to some embodiments.

Referring to FIG. 11, NAND flash structures were formed and tested using various dielectric materials between adjacent gate structures. The program voltage was estimated to be about 20V. The experimental results show that higher programming speed was achieved for the device structures having an air gap according to some embodiments than for either of the conventional silicon oxide or nitride materials without such an air gap between gate structures.

Figure 12:
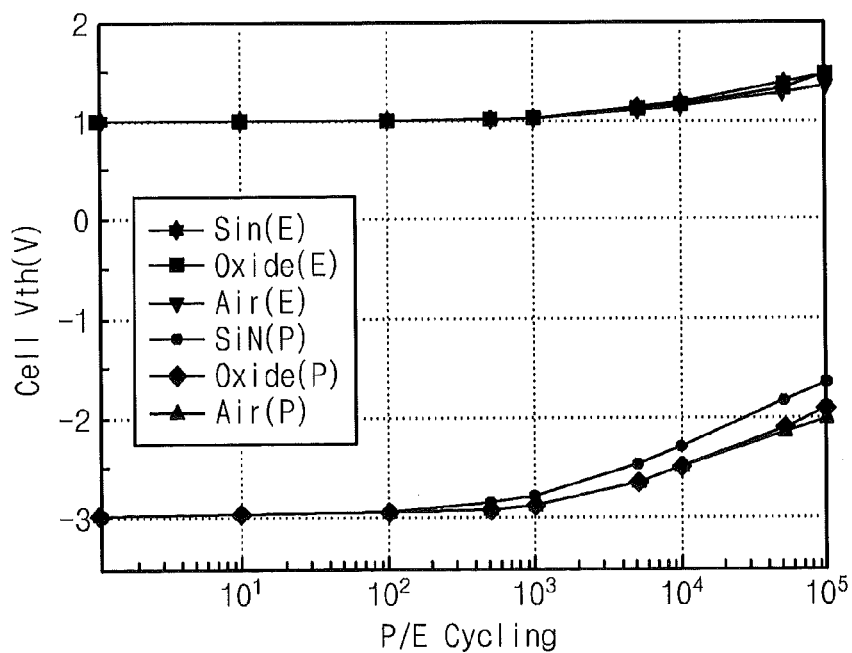
FIG. 12 is a plot of endurance characteristics for various dielectric materials.

FIG. 12 is a plot of endurance characteristics for various dielectric materials.

Referring to FIG. 12, the plot compares the endurance characteristics of a 1 Gbit NAND flash memory cell having a rectangular air gap defined between adjacent gate structures to cells using silicon nitride (SiN) or oxide filled between the gate structures without such an air gap. The plot shows that after extensive program/erase (P/E) cycling, negligible difference in the $V_{th}$ distribution between the device fabricated according to some embodiments and the cells having silicon nitride (SiN) or oxide filled between the gate structures without such an air gap is observed. Therefore, the endurance characteristics of the cell are not degraded by having an air gap as discussed above as opposed to the conventional structures.

Figure 13:
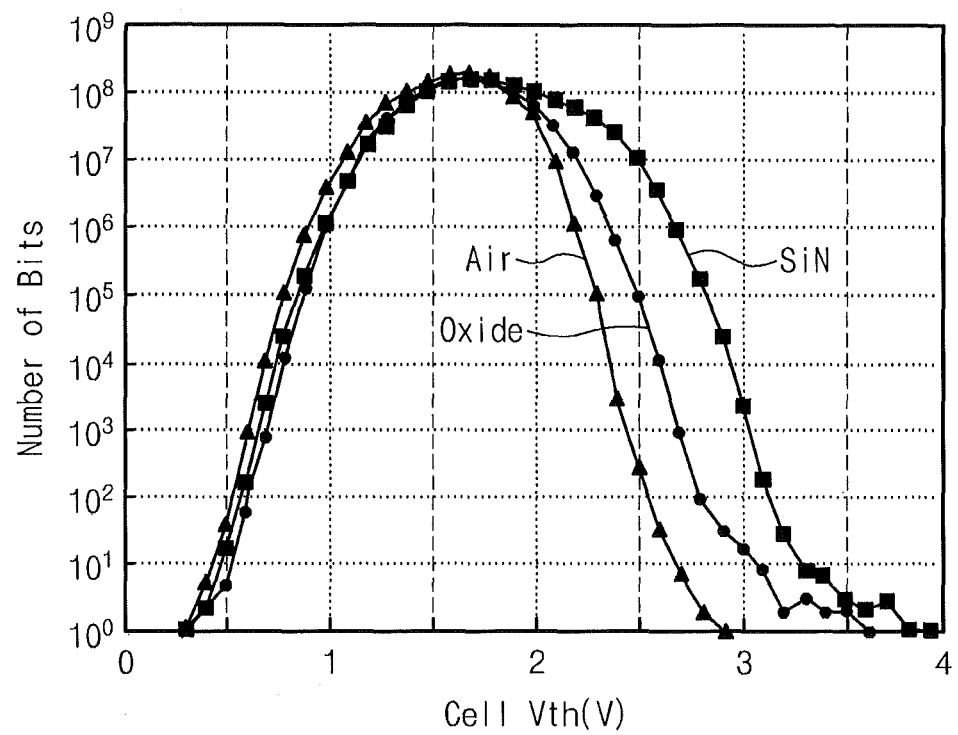
FIG. 13 is a plot of experimental results showing the threshold voltage distribution in a NAND flash memory for various dielectric materials.

FIG. 13 is a plot of experimental results showing the threshold voltage distribution in a 1 Gbit NAND flash memory for various dielectric materials.

Referring to FIG. 13, the plot compares the cell threshold voltage ($V_{th}$) distribution of a 1 Gbit NAND flash memory cell using a single pulse program. The plot shows that the $V_{th}$ distribution is dramatically improved with the cells formed according to some embodiments as opposed to the cells formed using prior art methods having oxide or silicon nitride (SiN) filled between gate structures without air gaps. This improvement in $V_{th}$ distribution is believed to be due to the improved floating gate voltage shift with the air gap.

Semiconductor devices, e.g., non-volatile memory devices formed according to some of the embodiments described herein can be used in various electronic systems such as cellular phones, digital cameras, digital televisions, and video game systems. Additionally, the memory devices can be used in various types of memory cards such as Compact Flash, Memory Stick, Extreme Digital (xD) Picture Card, Smart Media, and other multimedia card types. Further, non-volatile memory devices may be operatively coupled with other types of semiconductor devices, such as dynamic random access memory (DRAM) devices and/or, microprocessors, in the foregoing applications. In some cases, a non-volatile memory such as a NAND flash memory device and a DRAM device may be incorporated together in a single integrated circuit (IC) package, also known as a ND chip.

Figure 14A:
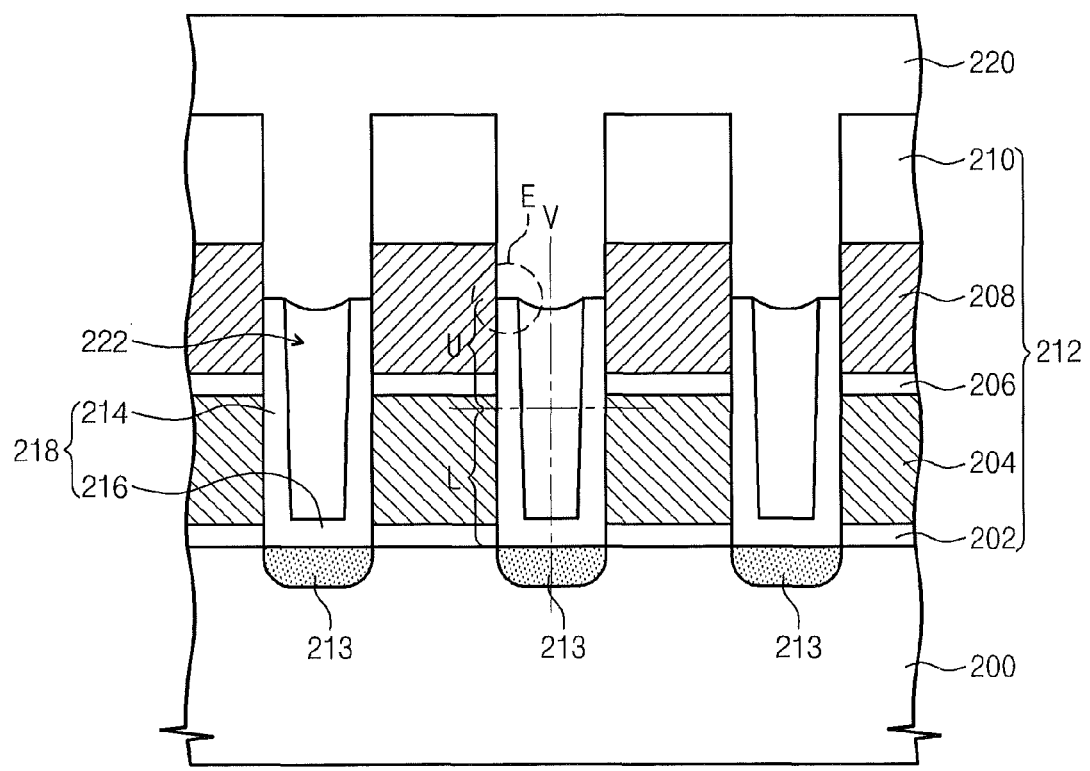
FIG. 14A is a cross-sectional view of a semiconductor device according to some embodiments.
Figure 14B:
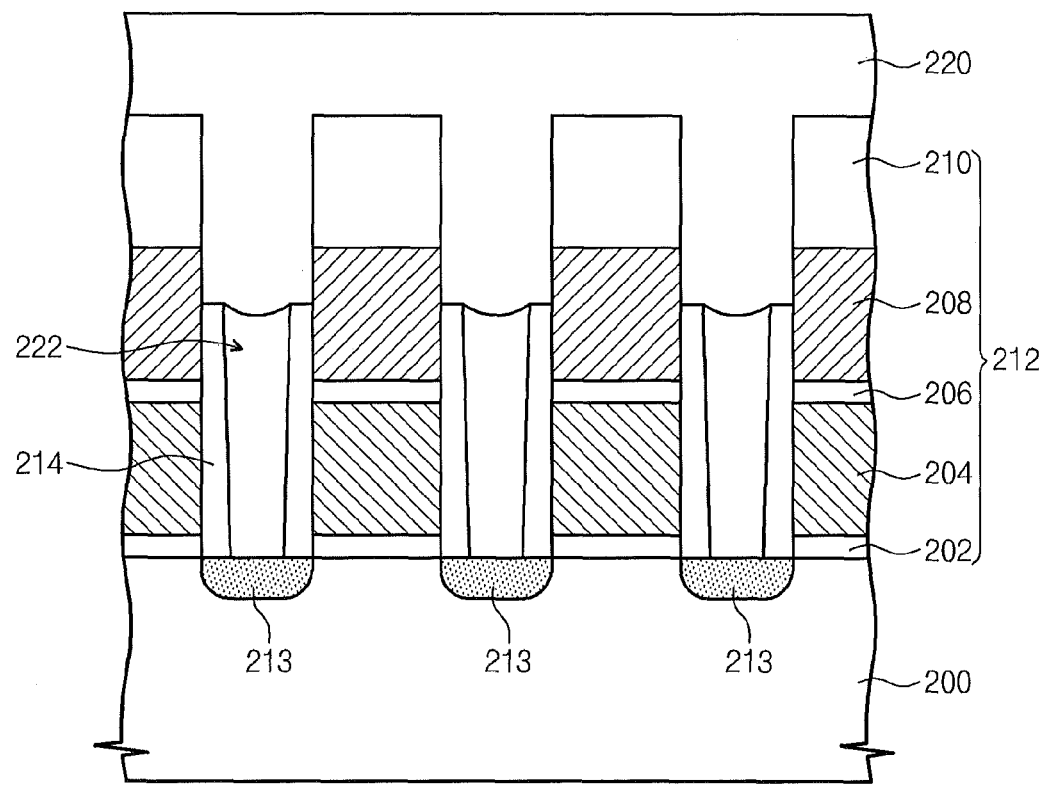
FIG. 14B is a cross-sectional view of a semiconductor device according to other embodiments.

FIG. 14A is a cross-sectional view of a semiconductor device according to some embodiments, and FIG. 14B is a cross-sectional view of a semiconductor device according to other embodiments.

Referring to FIGS. 14A and 14B, a semiconductor device may include a plurality of gate structures 212, liners 218, and an upper interlayer insulating/dielectric layer 220.

Each of the gate structures 212 may include a tunneling dielectric layer 202, a floating gate 204, an inter-gate dielectric layer 206, a control gate 208, and a mask layer 210, which may be sequentially stacked on a substrate 200.

The liners 218 may be disposed between the gate structures 212. Each of the liners 218 may include a horizontal portion 216 formed on the exposed substrate 200 between the gate structures 212 and vertical portions 214 extending substantially perpendicularly from a surface of the substrate 200 along sidewalls of opposing gate structures 212.

The vertical portions 214 of the liner 218 may be formed to cover a sidewall of the floating gate 204. For example, as shown in FIG. 14A, top surfaces of the vertical portions 214 may be substantially higher than a top surface of the floating gate 204 and substantially lower than a top surface of the mask layer 210. In particular, top surfaces of the vertical portions 214 may be more distant from the surface of the substrate 200 than the top surface of the floating gate 204 and less distant from the surface of the substrate 200 than the top surface of the mask layer 210.

Each of the vertical portions 214 may be divided into an upper portion (U) and a lower portion (L). An average width of the upper portion (U) of the vertical portion 214 may be substantially smaller than that of the lower portion (L) of the vertical portion 214. Thus, in some embodiments, the width of the vertical portion 214 may increase downwardly in a direction toward the surface of the substrate 200. Alternatively, the average width of the upper portion (U) of the vertical portion 214 may be substantially equal to that of the lower portion (L) of the vertical portion 214. Thus, in other embodiments, the vertical portion 214 may have a conformal width.

A side of an air gap 222 may be defined by one of the vertical portions 214. Thus, a side shape and a structure of the air gap 222 may be determined by the shape or structure of the vertical portion(s) 214. A width of the air gap 222 may increase in a direction from the surface of the substrate 200 to a surface of the air gap 222 that is distant from the surface of the substrate 200. Accordingly, a first width of the air gap 222 between the liners 218 may be adjacent the surface of the substrate 200 and may be less than a second width of the air gap 222 between the liners 218 that is more distant from the surface of the substrate 200. Impurity regions 213 may be disposed between the gate structures 212 and below the air gaps 222.

The horizontal portion 216 may be disposed between opposing vertical portions 214. According to some embodiments, the horizontal portion 216 and the opposing vertical portions 214 may be coupled with each other to form a single body. The horizontal portion 216 may have a thickness that is substantially the same as that of each of the opposing vertical portions 214. Accordingly, a bottom surface of the air gap 222 may be defined by the horizontal portion 216. Alternatively, referring to FIG. 14B, the thickness of the horizontal portion 216 may be zero. Accordingly, the bottom surface of the air gap 222 may be defined by the exposed substrate 200 between the opposing vertical portions 214.

According to some embodiments, the horizontal portion 216 may include a material that is substantially the same as a material that is included in the vertical portions 214. For example, the vertical portions 214 and the horizontal portion 216 may include nitride. According to other embodiments, the horizontal portion 216 may include a material that is substantially different from that of the vertical portions 214. For example, the vertical portions 214 may include nitride and the horizontal portion 216 may include oxide or deposition residue.

The upper interlayer dielectric layer 220 may be formed on the liners 218 to cover the gate structures 212. A top surface of the air gap 222 may be defined by the upper interlayer dielectric layer 220. The upper interlayer dielectric layer 220 may be formed to cover a space between upper portions of the opposing gate structures 212. Alternatively, the upper interlayer dielectric 220 may not be formed at a space between the opposing gate structures 212.

According to some embodiments, a bottom surface of the upper interlayer dielectric layer 220 in the space between the opposing gate structures 212 may have a downwardly concave shape. Thus, a contact portion between the upper interlayer dielectric layer 220 and the liners 218 may have a curvature, as shown in FIG. 14A, at the top surface of the air gap 222. A side portion (E) of the air gap 222 may have a reduced/minimum curvature at the upper portion (U) of the air gap 222. The side portion (E) may be offset toward one side at a virtual vertical axis (V) passing through the center of the air gap 222. A portion of the downwardly concave shape of the upper interlayer dielectric layer 220 that is closest to the surface of the substrate 200 may be at or near the vertical axis (V).

The air gap 222 may be disposed between the opposing gate structures 212. In particular, the air gap 222 may be disposed at least between the floating gates 204 of the opposing gate structures 212. According to some embodiments, the air gap 222 may be defined by the upper interlayer dielectric layer 220 and the liners 218 disposed between the opposing gate structures 212. Thus, the air gap 222 may have a shape and a construction corresponding to those of the upper interlayer dielectric 220 and the liners 218.

Figure 15A:
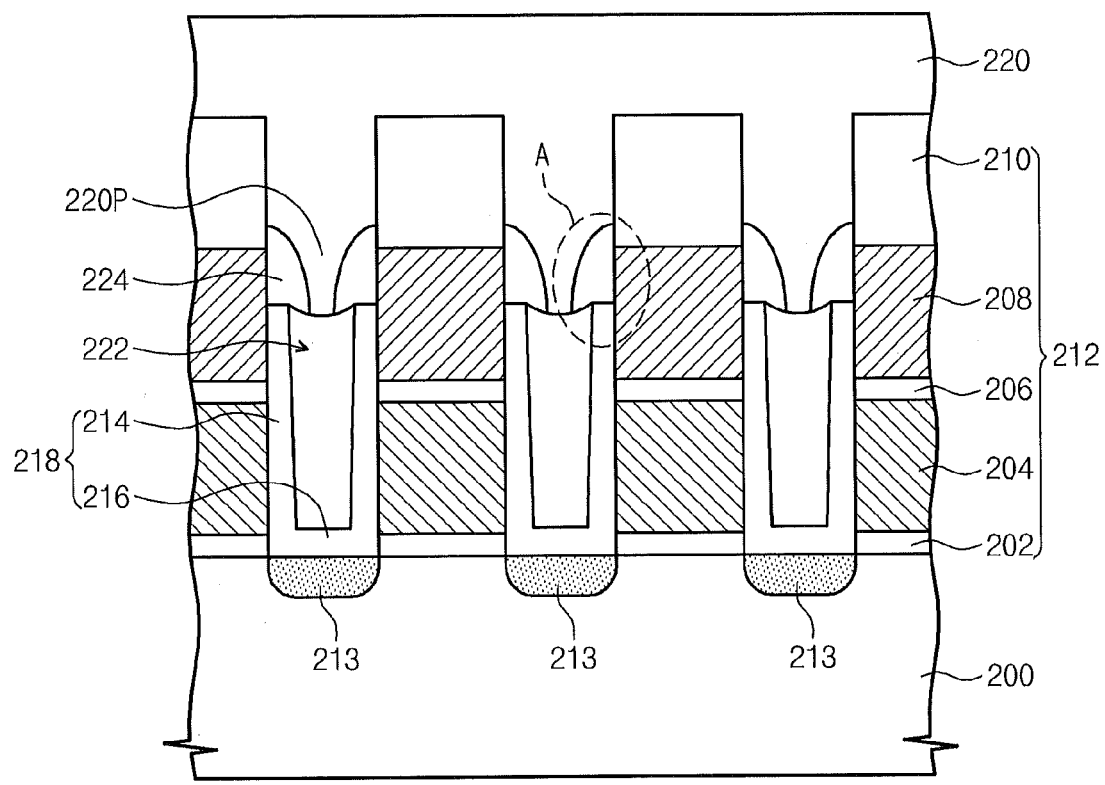
FIG. 15A is a cross-sectional view illustrating a semiconductor device according to some embodiments.
Figure 15B:
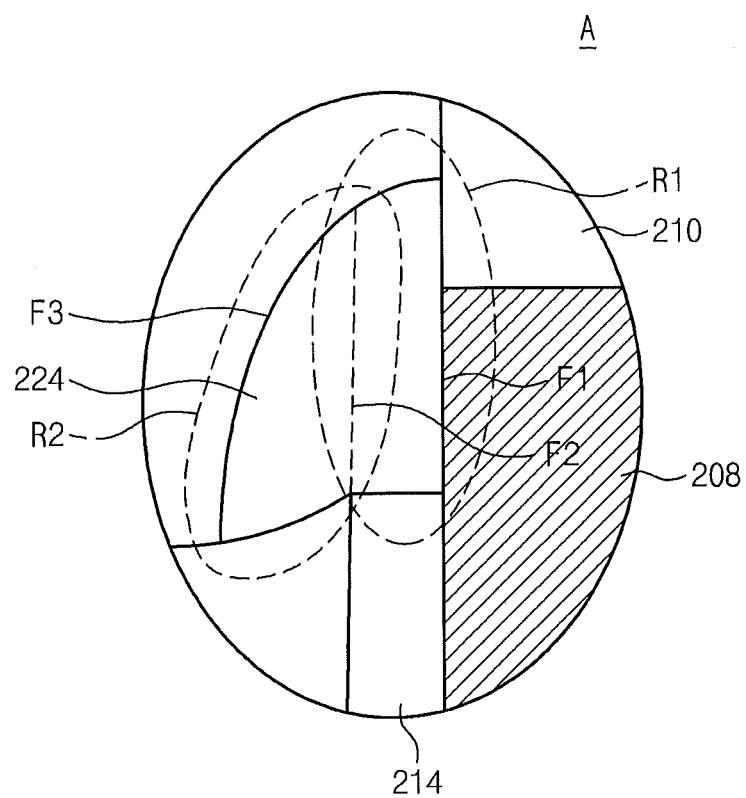
FIG. 15B is an enlarged view of a portion (A) shown in FIG. 15A.
Figure 15C:
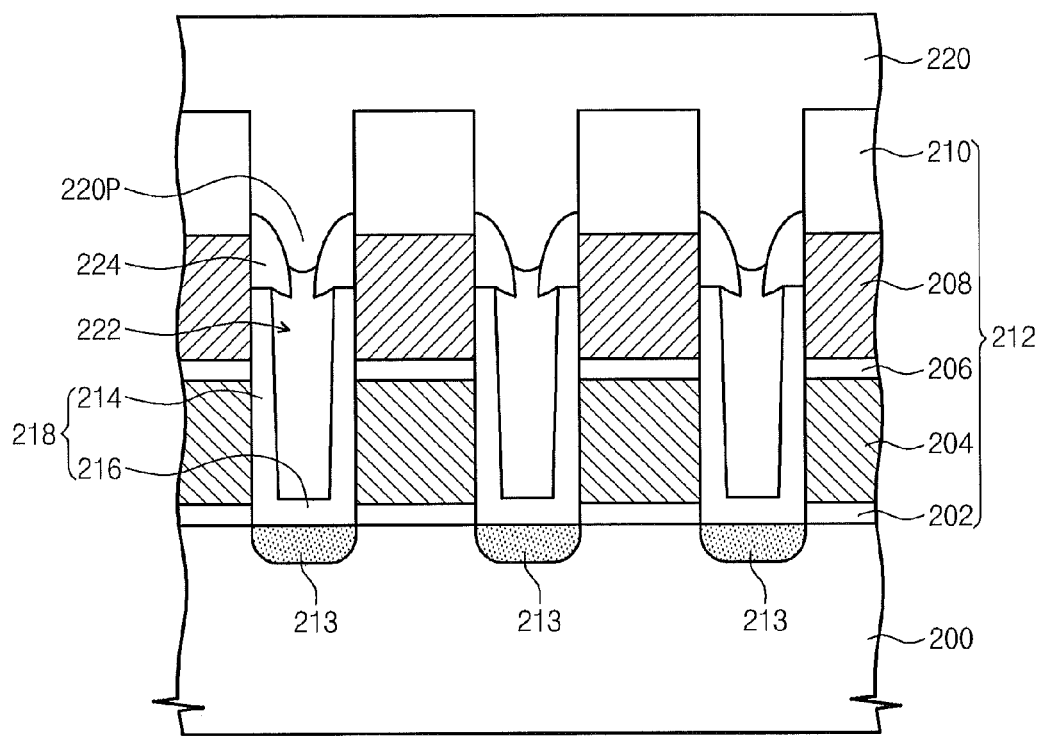
FIG. 15C is a cross-sectional view illustrating a semiconductor device according to other embodiments.
Figure 15D:
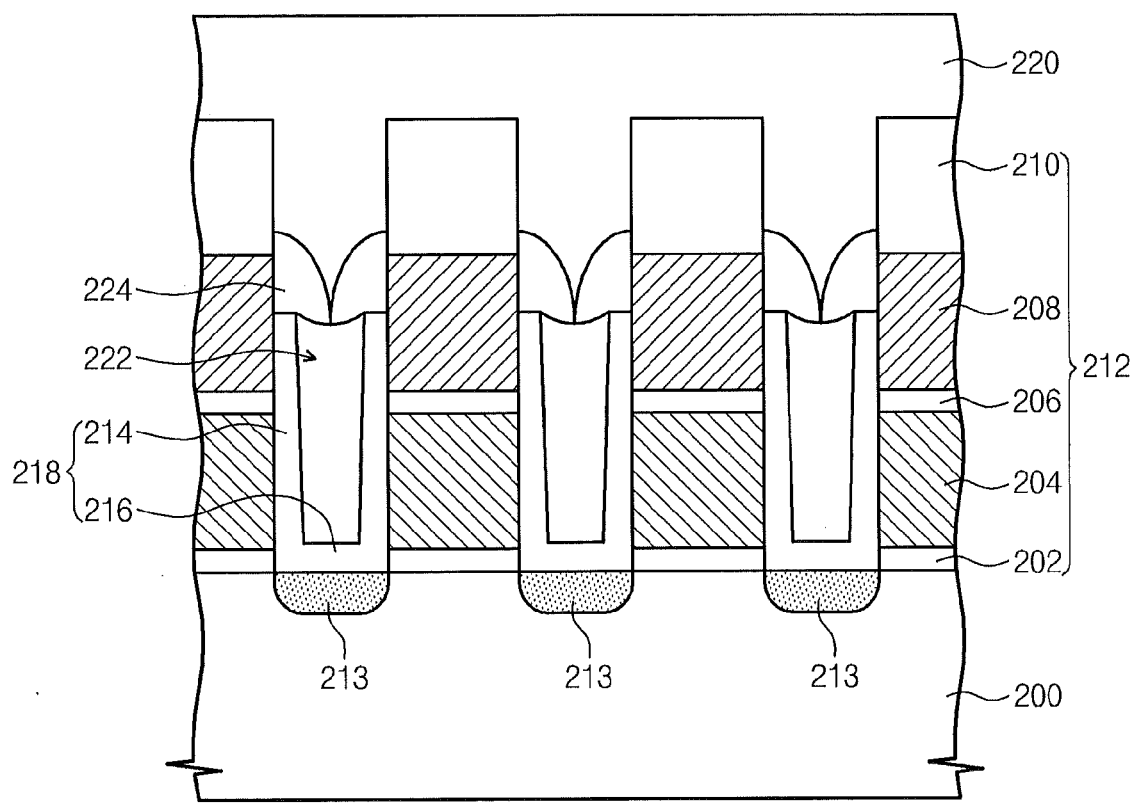
FIG. 15D is a cross-sectional view illustrating a semiconductor device according to yet other embodiments.

FIG. 15A is a cross-sectional view illustrating a semiconductor device according to some embodiments, and FIG. 15B is an enlarged view of a portion (A) shown in FIG. 15A. FIG. 15C is a cross-sectional view illustrating a semiconductor device according to other embodiments, and FIG. 15D is a cross-sectional view illustrating a semiconductor device according to yet other embodiments.

Referring to FIGS. 15A to 15D, a semiconductor device may include a plurality of gate structures 212, liners 218, and spacers 224, and an upper interlayer dielectric layer 220. The gate structures 212 and the liners 218 according to this embodiment are similar to the gate structures 212 and the liners 218 illustrated in FIGS. 14A and 14B and will not be described in further detail.

The spacers 224 may be disposed at upper portions of the liners 218. The spacers 224 may protrude from sidewalls of the opposing gate structures 212. Each of the spacers 224 may have a width that increases downwardly in a direction toward the surface of the substrate 200.

Referring to FIG. 15B, each of the spacers 224 may include a first region R1 contacting a side of the gate structure 212 and a second region R2 protruding from the first region R1. The first region R1 may have a first face F1 contacting the side of the gate structure 212 and a second face F2 opposing the first face F1. Each of the first and second faces F1 and F2 may be a substantially vertical face that is substantially perpendicular to the surface of the substrate 200. The second region R2 may have a third face F3 opposing the second face F2. The third face F3 may be a curved face. As shown in FIG. 15B, the third face F3 may have a convex curved surface.

According to some embodiments, the first region R1 of the spacer 224 may have a width that is substantially the same as that of the upper portion (U) of an underlying liner 218. The first region R1 of the spacer 224 and the liner 218 may have a single-body structure such that the spacer 224 and the liner 218 are coupled with each other. For example, portions of the liner 218 and the spacer 224 in the first region R1 may be made of nitride. The second region R2 of the spacer 224 may be made of nitride, and it may be formed by means of a different process from the first region R1. According to other embodiments, the spacer 224 and the liner 218 disposed below the spacer 224 may have a single-body structure such that the first and second regions R1 and R2 of the spacer 224 and the liner 218 are coupled with each other. Accordingly, the first and second regions R1 and R2 of the spacer 224 and the liner 218 may merge into a single body.

Referring to FIG. 15A, opposing spacers 224 may be spaced apart from each other. Accordingly, third faces F3 of the opposing spacers 224 may be disposed such that they are not in contact with each other. Alternatively, referring to FIG. 15D, opposing spacers 224 may be disposed to be in contact with each other. Accordingly, opposing third faces F3 of the opposing spacers 224 may be disposed to be in contact with each other in some embodiments.

The upper interlayer dielectric layer 220 may be disposed between upper portions of the gate structures 212. A top width/surface of the air gap 222 may be defined by the upper interlayer dielectric layer 220 and the opposing spacers 224.

Referring to FIG. 15A, in embodiments where the opposing spacers 224 are spaced apart from each other, the upper interlayer dielectric layer 220 may fill a space between the opposing spacers 224. The upper interlayer dielectric layer 220 may include a protrusion 220P disposed between the opposing spacers 224. A bottom surface of the protrusion 220P may be substantially as distant from the surface of the substrate 200 as a bottom surface of the second region R2 of the spacer 224. For example, the top width/surface of the air gap 222 defined by the spacers 224 and the upper interlayer dielectric layer 220 may have a concave surface. As another example, the top width/surface of the air gap 222 may be planarized.

Referring to FIG. 15C, in embodiments where the opposing spacers 224 are spaced apart from each other, the upper interlayer dielectric layer 220 may partially fill a space between the opposing spacers 224. The upper interlayer dielectric layer 220 may partially fill a space between upper portions of the opposing spacers 224. As such, the space between the opposing spacers 224 may be partially filled by the upper interlayer dielectric layer 220 and partially filled by the air gap 222. Thus, a bottom portion/surface of the protrusion 220P of the upper interlayer dielectric layer 220 may be substantially more distant from the surface of the substrate 200 than a bottom portion/surface of the second region R2 of the spacer 224 is distant from the surface of the substrate 200. A width of the air gap 222 may be greater, than a width of the protrusion 220P, where the widths may be measured along a plane that is substantially parallel with the surface of the substrate 200. Accordingly, the air gap 222 may have a bottle shape.

Referring to FIG. 15D, in embodiments where opposing spacers 224 are in contact with each other, an upper interlayer dielectric layer 220 may be disposed on the spacers 224 but not on the air gap 222. Accordingly, a top width/surface of the air gap 222 may be defined by the opposing spacers 224. For example, the top width/surface of the air gap 222 defined by the opposing spacers 224 may have a concave surface. Alternatively, the top width/surface of the air gap 222 may be planarized. Although air gaps have been discussed herein by way of example, any gap may be used according to embodiments of the present disclosure. A gap may be defined, for example, as any void or cavity, and may be a gap filled with air (e.g., an air gap), a gap filled with an inert gas or gases (e.g., an inert gas gap), a gap defining a vacuum (e.g., a vacuum gap), etc.

The foregoing description is illustrative and is not to be construed as limiting of the disclosure. Although a few example embodiments have been described, those skilled in the art will readily appreciate that many modifications are possible in the example embodiments without materially departing from the novel teachings and advantages of the disclosure. For example, the embodiments have been described with respect to NAND flash memory applications, but the inventive principles could also be applied to other types of memory devices, such as NOR-type flash memories. Accordingly, all such modifications are intended to be included within the scope of the disclosure as defined in the claims.

The invention claimed is:

1. A semiconductor device comprising:
   a plurality of gate structures on a surface of a semiconductor substrate, each of the gate structures including a floating gate, an inter-gate dielectric layer, and a control gate;
   liners on opposing sidewalls of first and second adjacent ones of the gate structures;
   spacers on the opposing sidewalls of the first and second gate structures; and
   an insulating layer on the spacers and partially filling between the spacers,
   wherein the spacers are spaced apart from the surface of the substrate,
   wherein a gap is defined between the liners on the opposing sidewalls of the first and second gate structures and between the surface of the substrate and the spacers, and is further defined by the insulating layer, and
   wherein a first width of the gap between the liners is adjacent the surface of the substrate and is less than a second width of the gap between the liners that is more distant from the surface of the substrate.

2. The device of claim 1, wherein each of the spacers has a vertical portion abutting one of the sidewalls of one of the first and second gate structures, and wherein a width of at least one of the spacers narrows in a direction away from the surface of the substrate.

3. The device of claim 1, wherein a thickness of each of the liners is smaller than that of each of the spacers.

4. The device of claim 1, wherein the liners on the opposing sidewalls of the first and second gate structures extend contiguously across the surface of the substrate.

5. The device of claim 4, wherein the liners are conformally formed on the opposing sidewalls of the first and second gate structures and on the substrate.

6. The device of claim 5, wherein a shape of the gap corresponds to the liners defining the sidewalls thereof.

7. The device of claim 4, wherein the liners on the opposing sidewalls of the first and second gate structures come into contact with each other.

8. The device of claim 1, wherein the second width of the gap is substantially concave.

9. The device of claim 1, wherein the insulating layer is on portions of the opposing sidewalls of the first and second gate structures exposed by the spacers.

10. The device of claim 1, wherein the spacers define an opening in the second width of the gap.

11. The device of claim 10, wherein the insulating layer seals the opening defined by the spacers.

12. The device of claim 11, wherein the insulating layer has a protruded portion and the protruded portion is between the spacers.

13. The device of claim 12, wherein the second width of the gap is greater than that of the protruded portion.

14. The device of claim 12, wherein the protruded portion is more distant from the surface of the substrate than a portion of at least one of the spacers.

15. The device of claim 1, wherein a width of the gap increases from the first width of the gap to the second width of the gap.

16. The device of claim 1, wherein the insulating layer includes a protruded portion between the spacers.

17. The device of claim 16, wherein the protruded portion of the insulating layer protrudes toward the surface of the substrate and is directly adjacent a portion of the gap that partially fills between the spacers.

* * * * *